Inventors
Arnold P. G. Peterson
Donald B. Sinclair
by Rines and Rines
Attorneys

Inventors
Arnold P. G. Peterson
Donald B. Sinclair
by Rines and Rines
Attorneys

Inventors
Arnold P. G. Peterson
Donald B. Sinclair
by Rines and Rines
Attorneys

Inventors
Arnold P. G. Peterson
Donald B. Sinclair
by Rines and Rines
Attorneys

Aug. 13, 1957 A. P. G. PETERSON ET AL 2,802,907

DISTORTIONLESS AUDIO AMPLIFIER

Filed Jan. 22, 1951 5 Sheets-Sheet 5

Inventors
Arnold P. G. Peterson
Donald B. Sinclair
by Rines and Rines
Attorneys

United States Patent Office 2,802,907
Patented Aug. 13, 1957

2,802,907

DISTORTIONLESS AUDIO AMPLIFIER

Arnold P. G. Peterson, Newton, and Donald B. Sinclair, Concord, Mass., assignors to General Radio Company, Cambridge, Mass., a corporation of Massachusetts Application January 22, 1951, Serial No. 207,155

20 Claims. (Cl. 179—171)

The present invention relates to amplifying systems and more particularly to the push-pull amplification of audio frequencies.

Many present-day audio-frequency push-pull amplifier circuits embody a pair of transformer primary windings in their output circuits. Incomplete coupling or leakage reactance between the output-circuit transformer primary windings produce, in such circuits, undesirable distortion effects including switching transients. Various proposals have been offered for attempting to eliminate such distortion. Among these, for example, is the use of appropriately connected bifilar primary windings in the push-pull amplifier output circuits, to reduce the leakage reactance between the push-pull output transformer primary windings, thereby to reduce the resulting distortion.

An object of the present invention, however, is to provide a new and improved system for eliminating such distortion effects.

In accordance with the present invention, indeed, the two primary windings of the push-pull output transformers may be entirely eliminated by employing a pair of series-connected amplifiers fed in anti-phase in order alternately to energize a common output load. The present invention, moreover, unlike prior series-connected amplifier arrangements, employs a type of phase-splitting input stage that insures that the amplifiers are fed oppositely phased input-signal cmponents that are the same function of both the original input-signal voltage and the voltage developed across the amplifier load, thereby to insure completely balanced operation. If desired, moreover, a pair of output-circuit transformer primary windings may also be employed in the circuits of the present invention, but in such a manner that incomplete coupling therebetween cannot introduce distortion.

A further object of the present invention is to provide a push-pull audio-frequency amplifying circuit that not only is relatively free of distortion, but that is relatively inexpensive to manufacture.

Other and further objects will be pointed out hereinafter and will be particularly defined in the appended claims.

Figure 2:
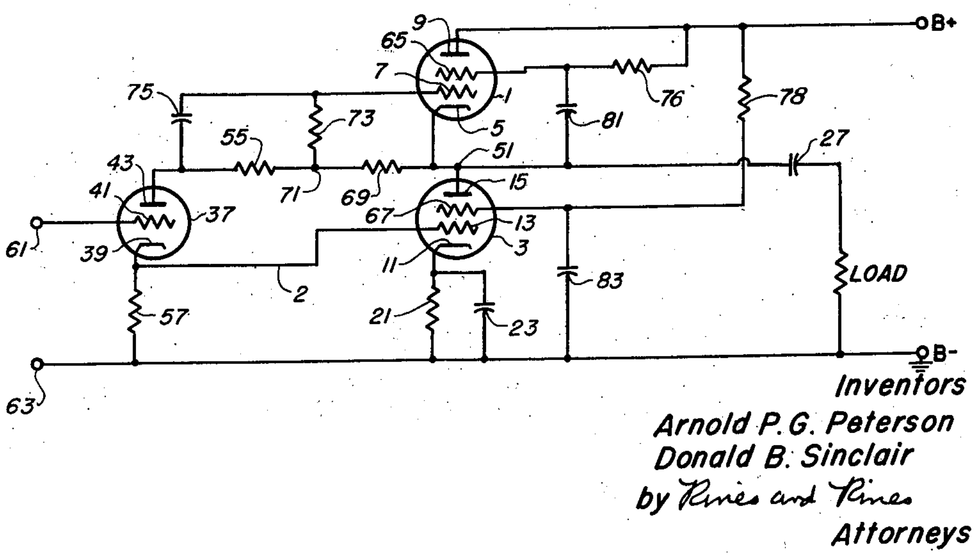
Figure 3:
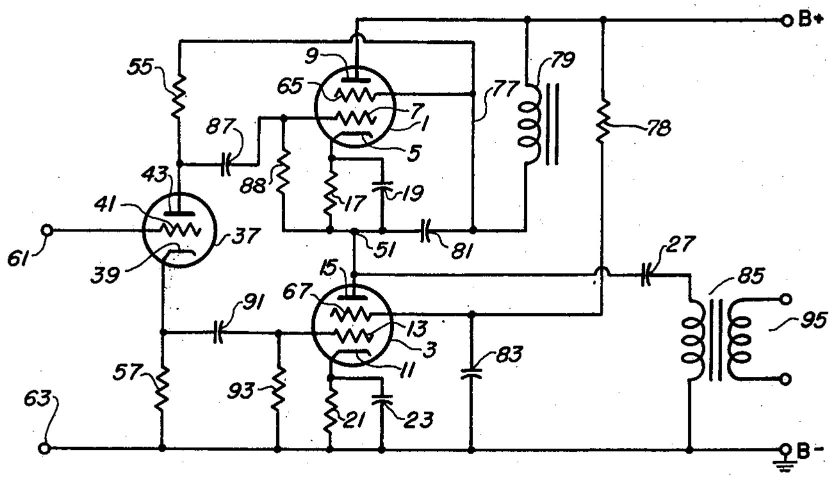
Figure 4:
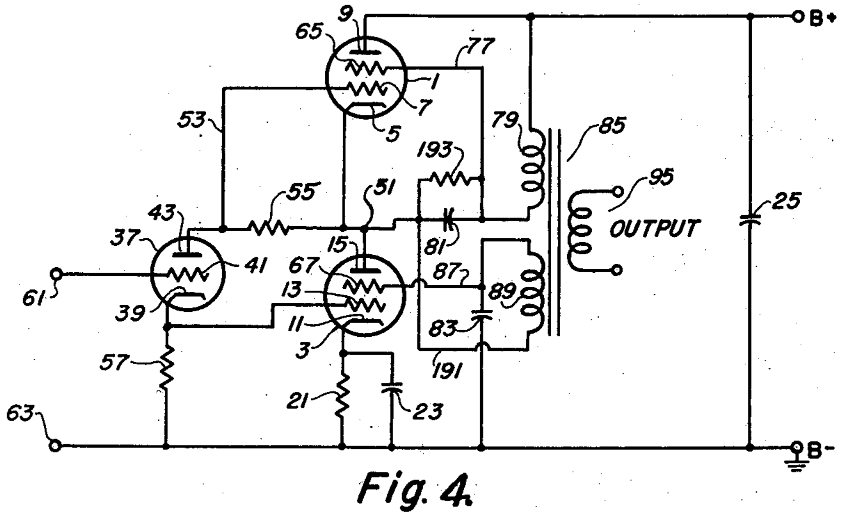
Figure 5:
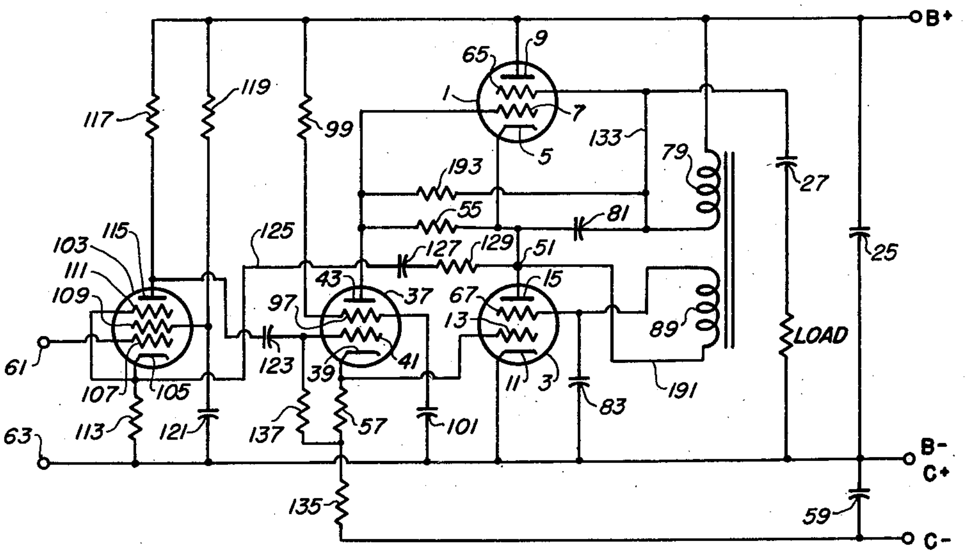
Figure 6:
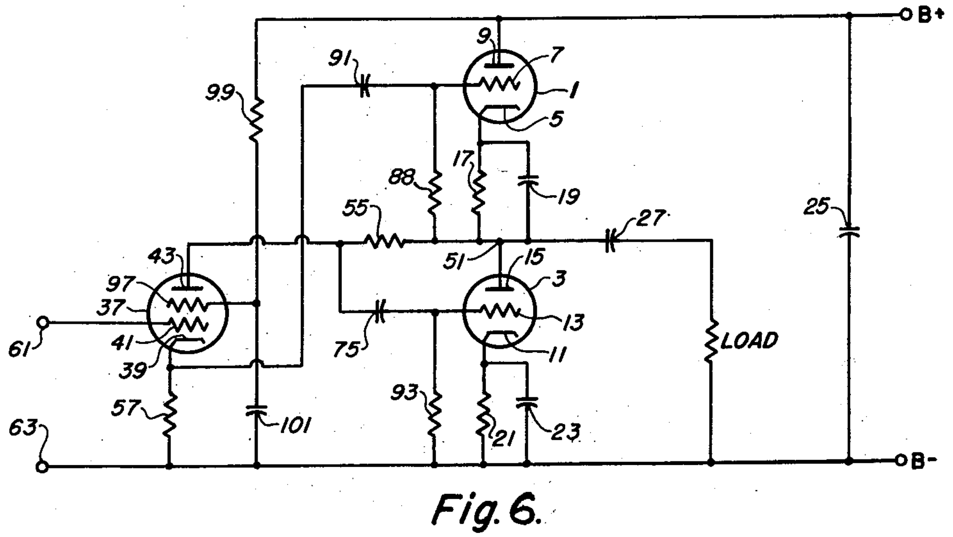
Figure 7:
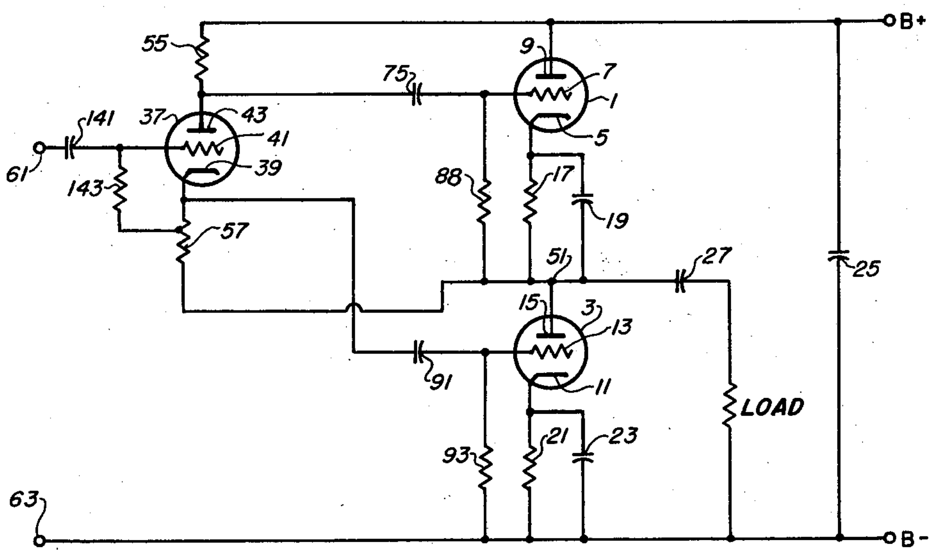
Figure 8:
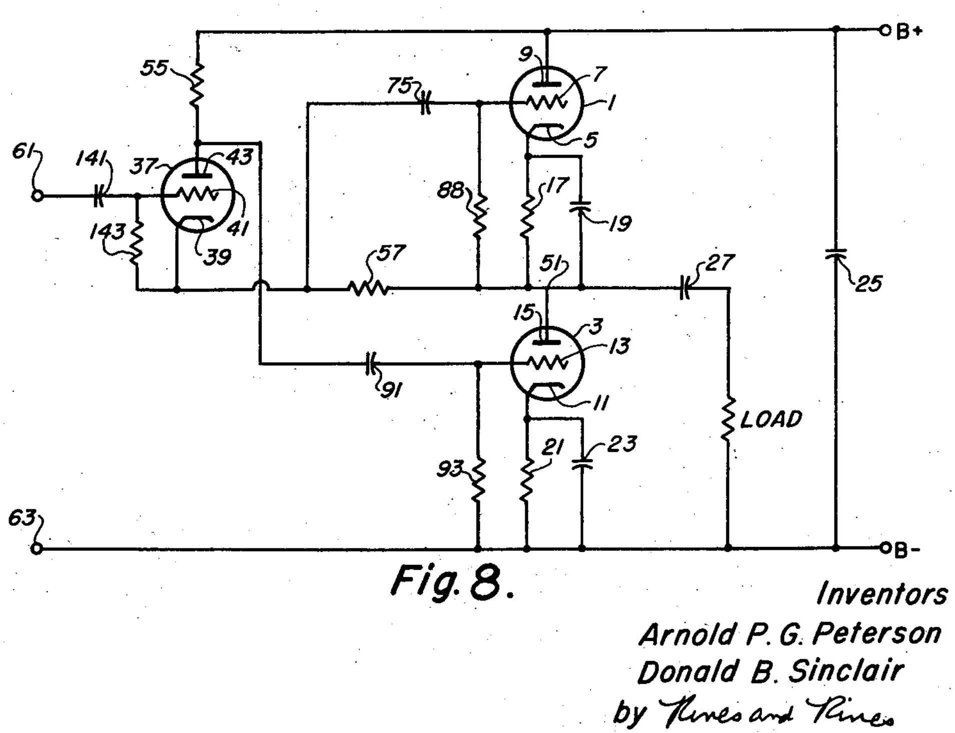
Figure 9:
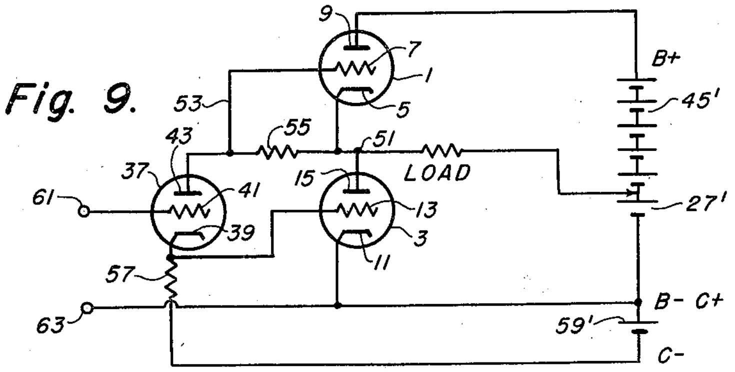
Figure 10:
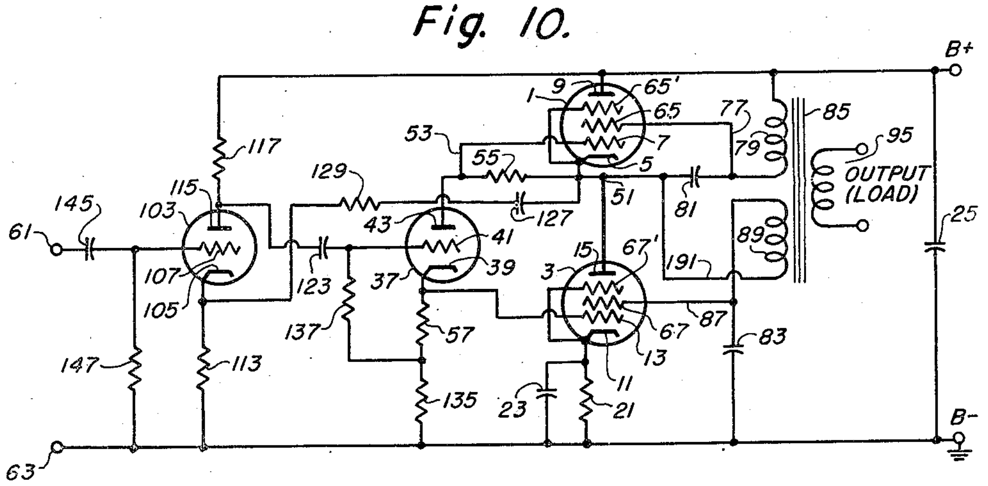

The invention will now be explained in connection with the accompanying drawings, Fig. 1 of which is a schematic circuit diagram illustrating a simplified embodiment of the present invention; Fig. 2 is a diagram of a modification utilizing beam-power amplifier tubes; Fig. 3 is a similar diagram of a modification embodying an output matching transformer and a choke coil for eliminating power absorption; Fig. 4 is a circuit diagram similar to Fig. 3 in which the functions of the choke coil and the matching transformer have been combined in a single transformer; Fig. 5 illustrates a further modification adapted to obtain high-voltage outputs; Figs. 6 to 8 are diagrams of further modified circuits similar to Fig. 1 but embodying different types of input phase-inverter stages; Fig. 9 illustrates a modification of the circuit of Fig. 1; and Fig. 10 is a circuit diagram of a preferred embodiment of the invention.

Figure 1:
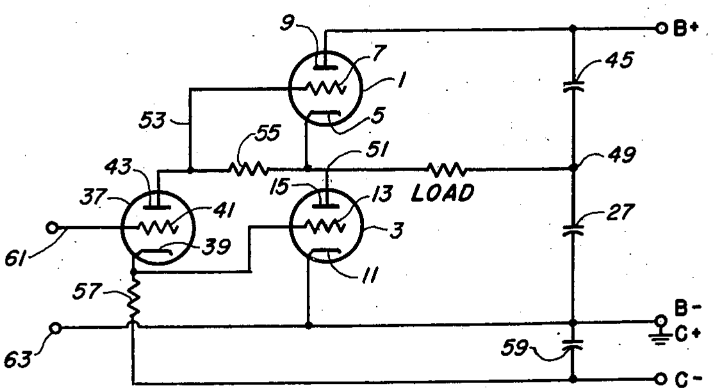

Referring first to Fig. 1, a pair of balanced vacuum-tube three-electrode or triode output amplifiers is illustrated at 1 and 3, each amplifier being provided with a cathode, a control electrode and an anode or plate. For convenience in explanation of the operation of this circuit and the similar circuits of the various modifications later discussed, the amplifier 1 may hereinafter be referred to as the upper amplifier, and the amplifier 3, as the lower amplifier. The amplifier 1 is shown having a cathode 5, a control electrode 7 and a plate 9. The amplifier 3 is similarly shown provided with a cathode 11, a control electrode 13 and a plate 15. The cathode 5 of the amplifier 1, furthermore, is connected to a terminal or juncture 51 that, in turn, is connected to the plate 15 of the amplifier 3, and the plate 9 of the amplifier 1 is connected to the positive or B+ terminal of the anode or plate-supply potential or voltage. The cathode 11 of the amplifier 3 is connected to the negative or B— terminal of the anode or plate-supply voltage which may, if desired, be grounded, as shown. The upper and lower amplifiers 1 and 3 are therefore connected in series relationship. A pair of similar plate-supply voltage storage condensers 45 and 27, series-connected at a point 49 is provided between the terminals B+ and B— connected between the plate 9 of the upper amplifier 1 and the cathode 11 of the lower amplifier 3 in series with the series-connected amplifiers 1 and 3. Between the plate 15 and the cathode 11 of the amplifier 3, an electric circuit is connected comprising the before-mentioned condenser 27 in series with a load impedance of any desired type, labeled "load." The load is thus connected between the terminal or juncture 51 and ground.

Assuming, for the moment, for example, that the tube 3 is cut off and therefore non-conducting, and that the tube 1 is rendered conductive, it will be observed that the condenser 27 will store electric energy, being charged not only through condenser 45, but also, in the circuit traceable from the upper terminal 49 of the condenser 27 through the before-mentioned load impedance to the cathode 5 of the amplifier 1, through the tube 1 to its plate 9 and to the upper or B+ terminal of the storage condenser 45; thence, from the B— terminal to the lower terminal of the condenser 27. During this process of charging the condenser 27 upon the rendering conductive of the amplifier 1, the amplifier 1 also feeds its output voltage across the load impedance.

If, now, it be assumed that the amplifier 1 is rendered ineffective, as when biased to cut off, and that the amplifier 3 is rendered conductive, the charged condenser 27 is a source of plate voltage for the amplifier 3 in the circuit traceable from the upper terminal of the condenser 27 through the load impedance to the plate 15 of the amplifier 3, thence through the tube 3 to its cathode 11 and to the lower terminal of the condenser 27. Not only does the condenser 27 thus supply plate voltage for the amplifier 3, but any output voltage developed across the amplifier 3 is fed, also, across the load impedance.

In this manner, the amplifiers 1 and 3 are rendered alternately effective to feed their output voltages across the common load impedance of the respective output circuits. It is to be understood, of course, that the above example of conducting and non-conducting tubes is presented for illustrative purposes only. In actual practice, the tubes are generally actually conducting over a considerable portion, if not all, of the cycle of the input signals, the conductivity being varied over any desired small or wide range extending into the region of cut-off of the tubes, depending upon the desired operating characteristics. It is also to be observed that the energy-storing condenser 27 and the load impedance alternatively could have been connected between the plate and cathode of the upper amplifier 1 to produce similar results upon the alternate rendering effective of the amplifiers 3 and 1 to feed the common load.

Whereas the source of plate voltage for the amplifiers 3 and 1 has been obtained by utilizing the respective energy-storing condensers 27 and 45, it is further to be understood that the condensers 27 and 45 are but one form of a source or generator of direct-current energy having a low alternatiing-current impedance that can be utilized in accordance with the present invention. In the circuit of Fig. 9, later discussed, such condensers are shown replaced by batteries. For practical considerations of commercial circuit design, however, the condensers may be preferable sources of energy.

It remains now to explain how the amplifiers 1 and 3 may be rendered alternately effective in response to, for example, audio-frequency signal voltages, to feed the load. While the circuits of all of the embodiments of the present invention are particularly well suited to the audio range of frequencies and will be described for illustrative purposes as utilized therewith, the present invention is, however, by no means so limited in its applications, being usable also with sub-audio and super-audio frequencies, including radio frequencies.

One of the important distinctions between the present invention and the conventional push-pull amplifiers employing output transformer primaries resides in the fact that the push-pull amplifiers of the present invention permit the flow of current from each amplifier to a common load instead of to different transformer windings. As a result, the problem of tightly coupling the output transformer primary windings of conventional push-pull amplifiers does not exist in the circuits of the present invention and superior performance is obtained, particularly at high frequencies where the leakage reactance produced between the output transformer windings of present-day push-pull amplifiers introduces disadvantageous switching transients. Since the output transformer may be eliminated, moreover, the manufacturing cost of the amplifier may be markedly reduced.

It is important in the circuit of Fig. 1 that the driving or input voltage be applied to each amplifier tube with respect to its own cathode and not with respect to the negative B− terminal of the plate-supply voltage, for it is in this manner that the tubes 1 and 3 may be operated in push-pull to feed comparable output voltages to the common load. Were a transformer type of input circuit utilized there would be introduced certain difficulties including the capacitance-to-ground of the transformer windings that add effective capacitance across the load, thereby affecting the phase relationships of the input signals fed to the two amplifiers 1 and 3. An input transformer, furthermore, is a relatively expensive component, and it is preferable that it be not employed.

In accordance with the preferred embodiment of the present invention, therefore, the anti-phase input voltages are derived not from an input transformer, but, rather, from appropriate phase-inverter, vacuum-tube, driver-stage circuits. Referring to Fig. 1, such a phase-inverter driver stage is illustrated at 37 provided with a cathode 39, a control electrode 41 and a plate or anode 43. The plate 43 of the phase-inverter tube 37 is connected by a conductor 53 directly to the control electrode 7 of the amplifier 1. The plate 43 is also connected through a plate resistor 55 to the terminal 51 so that an input signal modified from the value it would assume in the absence of the load signal at the terminal or juncture 51 (in this case lifted thereabove) is applied to the control-grid electrode 7 of the amplifier 1. A resistor 57, substantially equal in value to the value of the plate resistance 55, is connected from the cathode 39 of the phase-inverter tube 37 to a source of negative C− bias potential developed across a storage condenser 59 with respect to the B− terminal of the previously described plate-supply voltage. The B− terminal of the plate-supply voltage is thus the C+ terminal of the bias voltage.

In the circuit of Fig. 1, the input signals, such as the before-mentioned audio-frequency signals, are fed from terminals 61 and 63 between the control electrode 41 and the cathode 39 of the phase-inverter input stage 37. The terminal 61 is shown connected directly to the control electrode 41. The terminal 63 is shown connected to the grounded B− terminal and, through the C− bias voltage supply, to the cathode load 57, and thence to the cathode 39 of the phase-inverter tube 37. Since the resistors 55 and 57 are substantially equal in value, there are developed across the resistor 55 and across the resistor 57 voltages of substantially equal magnitude or amplitude, but of opposite phase, in view of the fact that the resistor 55 is in the plate circuit of the phase-inverter stage 37 and the resistor 57 is in the cathode circuit. It is to be noted that the input voltages are applied to the control grid of each of the series-connected amplifiers 1 and 3 with respect to the cathode of the respective amplifiers. The connection of the load between the plate 15 of the amplifier 3 and the condenser 27 has the advantage of reducing any hum which might appear in the load as a result of inadequate filtering of the plate-supply voltage source.

Direct-current bias voltage for the upper amplifier tube 1 is obtained through the medium of the voltage drop across the plate resistor 55 of the phase-inverter tube 37 which, as before described, is connected between the control electrode 7 and the cathode 5 of the amplifier 1. Direct-current bias voltage is obtained for the lower series-connected amplifier 3 from the separate C− bias supply voltage appearing across the resistor 57, connected between the control electrode 13 and the cathode 11 of the amplifier 3. The value of the C− bias voltage is made approximately twice the bias voltage that would normally be employed with the amplifiers 1 and 3 since there is developed across the cathode resistor 57 a voltage equivalent to the normal bias voltage but of opposite polarity, resulting from its connection in the cathode circuit of the phase-inverter tube 37. The direct-current bias voltage for the tube 3 may also, of course, be obtained in other ways, as by using a by-passed resistor in the cathode of the amplifier 3, as will later be discussed in connection with the embodiment of Fig. 2.

In the operation of the circuit of Fig. 1, therefore, the tubes 1 and 3 are rendered alternately effective to feed the load in response to the anti-phase components of the input signals developed between their respective control electrodes and cathodes. When the upper tube 1 is effective, it feeds its output voltage across the load in the circuit traceable from the B+ terminal of the plate supply to the plate 9, through the upper amplifier 1 to its cathode 5, and through the load and the condenser 27 to the negative B− terminal of the plate-supply voltage. Since the plate current of the phase-inverter tube 37 flows through the amplifier 1 but not through the amplifier 3, because of the connection of the plate load 55 of the phase-inverter 37 between the control electrode 7 and cathode 5 of the amplifier 1, a slight unbalance may be introduced into the operation of the upper and lower push-pull amplifiers. The plate current of the phase-inverter tube 37, however, is usually quite small compared to the plate current drawn by the amplifiers 1 and 3, so that this slight unbalance is usually of little significance. It may, however, be compensated for by a small unbalance in the values of the bias voltages applied to the control electrodes 7 and 13 of the amplifiers 1 and 3, or in the manner hereinafter discussed in connection with the embodiment of Fig. 9. It may also be corrected by connecting an appropriate resistor, not shown, from the B+ terminal of the plate-supply voltage to the terminal 51 between the series-connected amplifiers 1 and 3, the value of the resistor being selected so that the same current flows through it as flows through the phase-inverter tube 37. Instead of a balancing resistor, moreover, a choke coil may be employed, as is later discussed in connection with the embodiment of Fig. 3, the coil eliminating any power absorption that might accompany the use of a balancing resistor. For many practical purposes, however, the slightly unbalanced condition before referred to requires no compensation.

The significance of the previous statement that the anti-phase signal-component voltages applied to the input circuits of the amplifiers 1 and 3 of Fig. 1 should be applied between the respective control electrodes and cathodes of the amplifiers 1 and 3, may now be explained. If, for example, the input voltage applied to the amplifier 1 were developed not between the control electrode 7 and the cathode 5 of the amplifier 1, but, rather, between the control electrode 7 and ground, the amplifier 1 would operate substantially as a cathode-follower tube. If, however, the voltage applied to the amplifier 3 is also developed between its control electrode 13 and ground, the tube 3 will operate with a normal plate load. The amplifiers 1 and 3 would then not operate with anywhere near equal gain, and unbalanced outputs would be obtained.

The results obtainable with the circuit of Fig. 1 have been found to be similar to those obtainable with conventional push-pull amplifiers, but without disadvantageous distortion or unbalance effects and relatively high cost of manufacture before described. In view of the use with the amplifiers of the above-described particular type of phase-inserter stage 37, indeed, which, unlike other types of mere phase-reversing stages, actually splits the input signal into two anti-phase signal components of substantially the same function of both the input signal and the voltage developed across the amplifier load, each of the amplifiers 1 and 3 amplifies all of the frequencies, including distortion products and other components, that the other amplifier amplifies. Truly balanced operation is thus obtainable. The amplifiers 1 and 3 may, of course, be operated beyond their linear range such as in the so-called class AB–2 region. Further advantages will be later pointed out in connection with other embodiments of the invention.

As before stated, the energy-storing condensers 27 and 45 that serve as sources of direct-current energy for the plate circuits of the amplifiers 1 and 3, may be replaced by any other type of direct-current generators of low alternating-current impedance such as the energy-storing batteries 45′ and 27′ of Fig. 9. It is to be understood, moreover, that this replacement may be effected in all the other embodiments of the invention. In other respects the circuits of Figs. 1 and 9 are the same, so that a detailed description is not necessary. The load is shown connected to the energy source 45′—27′ of the amplifier 1 at a point other than the intermediate or center point of the source. In practice, in order to maintain balance in the amplifier stages, as before discussed, it may be necessary, because of initial unbalanced conditions, to utilize different values of voltage in the plate circuits of the two amplifiers. It is for this reason that the load is shown provided with a variable tap connection for the purpose of adjusting the balanced operation of the stages 1 and 3.

While the circuits of Figs. 1 and 9 have been illustrated as applied to three-electrode or triode vacuum-tube amplifiers 1 and 3, it is to be understood that the series-connected balanced output amplifiers 1 and 3 may be tetrodes, pentodes or any other types of amplifiers including transistor amplifiers. Since present-day triodes are not very satisfactory for large power outputs, beam-power tetrodes may advantageously be employed where high power is desired. When using tetrodes, however, it is necessary to obtain some sort of satisfactory means for supplying the screen electrodes of the tetrodes with proper direct-current voltages, and at the same time to maintain the alternating-current potential of the screen electrodes equal to that on the cathodes of the respective amplifiers. A satisfactory circuit of this character is illustrated in Fig. 2.

In the embodiment of Fig. 2, the phase-inverter driver stage 37 is connected to the series-connected amplifiers 1 and 3 in a manner similar to that illustrated in Fig. 1. The amplifiers 1 and 3 differ from the amplifiers of Figs. 1 and 9 in that they are of the tetrode type, embodying respective screen electrodes 65 and 67. The cathode 5 of the upper amplifier 1 is connected at the terminal junction 51 to the plate 15 of the lower amplifier 3, and the terminal 51 is, in turn, connected through the condenser 27 and the series-connected load to the negative or B— side of the plate-supply voltage. The plate 9 of the upper amplifier 1 is connected to the B+ terminal of the plate-supply voltage. The plate 43 of the phase-inverter tube 37 is connected through two series-connected plate load resistors 55 and 69 to the terminal 51 between the cathode 5 of the amplifier 1 and the plate 15 of the amplifier 3. The junction 71 of the series-connected plate resistors 55 and 69 is connected through a further resistor 73 to the control electrode 7 of the amplifier 1. The plate 43 of the phase inverter driver or input stage 37 is coupled by a condenser 75 to the control electrode 7 of the upper amplifier 1. The cathode resistor 57 of the phase-inverter tube 37 is connected to the grounded negative B— terminal of the plate-supply voltage, and the cathode 39 is connected directly by a conductor 2 to the control electrode 13 of the lower amplifier 3. A cathode resistor 21 and a decoupling or by-pass condenser 23, are employed in the cathode circuit of the amplifier 3. Screen potential for the screen electrodes 65 and 67 of the respective amplifiers 1 and 3 is obtained from the B+ terminal of the plate-supply voltage through respective screen-dropping resistors 76 and 78, and the screen electrodes 65 and 67 are respectively connected to the respective cathodes 5 and 11 through by-pass condensers 81 and 83. In this manner, the screen electrodes are kept at the same alternating-current potential as the respective cathodes.

The operation of the circuit of Fig. 2 is the same as that previously discussed in connection with Figs. 1 and 9, with the rendering effective of the amplifier 1 causing the amplifier 1 to feed the load and to effect the charging of the condenser 27. The subsequent rendering effective of the amplifier 3 similarly causes the output voltage of the amplifier 3 to appear across the common load under the action of the plate voltage supplied by the charged condenser 27. In the system of Fig. 1, however, the driving or input voltage is limited by the fact that the plate current flowing through the phase inverter 37 is reduced to zero when an input-voltage swing is applied to the amplifier 1 and 3 of magnitude equal to the grid bias maintained upon the control electrodes of the amplifiers 1 and 3. Considerable distortion of the driving signals may thus occur. This distortion may be reduced by making the effective plate impedance of the phase-inverter for the alternating-current signals greater than the plate impedance for the bias voltage. This end is accomplished in the system of Fig. 2 through the medium of the resistance-capacitance circuit 55, 69, 73, 75.

The screen dropping resistor 76 of Fig. 2 may, during the operation of this circuit, absorb considerable power which, for some applications, can not afford to be lost. The circuit of Fig. 3 is designed, accordingly, to eliminate such power absorption by supplying the screen voltage to the screen electrode 65 of the amplifier 1 from the B+ supply terminal by means of a choke coil 79 and a conductor 77. The screen voltage of the screen electrode 67 of the amplifier 3 is connected to the B+ terminal through the dropping resistor 78 and is by-passed by the condenser 83, as discussed in connection with Fig. 2. The screen electrode 65 of the amplifier 1 is connected to the cathode 5 thereof, in so far as alternating-current signals are concerned, by the condenser 81. The output circuits of the amplifiers 1 and 3 are similar to those previously described in connection with the embodiment of Fig. 1 except that the load has taken the form of a matching transformer 85, the secondary 95 of which may, for example, be caused to drive a loud speaker, not shown. It is to be understood, furthermore, that a similar load may, of course, be employed with any of the other embodiments of the invention. Such a matching transformer would, indeed, be required where the ultimate load impedance is markedly different from that required for best operation of the series-connected amplifiers 1 and 3. The cathode 5 of the amplifier 1 is provided with a cathode resistor 17 and a by-pass condenser 19.

The phase-inverter stage 37, however, is connected in a somewhat different manner than its connection in the circuits of Figs. 1 and 2 in order to make possible a wider operating swing for a given plate current change in the driving or input stage. The plate 43 of the phase-inverter tube 37 obtains its plate potential through the plate load 55 by way of the same choke coil 79 that feeds screen potential to the screen electrode 65 of the upper amplifier 1. This makes available a larger direct-current plate supply for the phase-inverter driver or input stage than is possible when the plate resistor 55 is connected to the terminal junction 51 between the series-connected amplifiers 1 and 3, as in Figs. 1 and 2. The alternating-current output from the plate 43 of the phase-inverter stage 37 is coupled through a condenser 87 to the control electrode 7 of the upper amplifier 1 which, in turn, is provided with a grid-to-cathode resistor 88. The cathode 39 of the phase inverter is similarly coupled through a condenser 91 to the control electrode 13 of the lower amplifier 3, and a grid-to-cathode resistor 93 is also therein employed. The voltage applied from the plate circuit of the phase-inverter stage 37 to the amplifier 1, however, still is developed between the control electrode 7 and the cathode 5 thereof, since the screen electrode 65 is by-passed to the cathode 5 by the condenser 81. The signal from the cathode load 57 of the phase-inverter 37 is also coupled by the condenser 91 between the control electrode 13 and the cathode 11 of the amplifier 3.

These condenser coupling connections of Fig. 3, while satisfactory for many applications of the present invention, may be not so advantageous for other applications where the low-frequency phase shifts introduced by the alternating-current coupling is objectionable. It is preferable, indeed, for many purposes, to use direct-current coupling without the aid of coupling condensers, as illustrated in Fig. 4. Sufficient voltage from the phase inverter can, in general, be obtained by direct connections from the phase-inverter to the amplifiers. The phase-inverter 37 in Fig. 4 is connected to the amplifiers 1 and 3 in a manner similar to that illustrated in Fig. 1, the plate 43 being directly connected by the conductor 53 to the control electrode 7 of the amplifier 1 and through the plate load 55 to the cathode 5 thereof. The cathode 39 of the phase inverter is directly connected to the control electrode 13 of the amplifier 3. The cathode load 57 is, in turn connected between the control electrode 13 and the cathode 11 of the amplifier 3, the cathode 11 being provided with the cathode resistance-capacitance combination 21—23, before described. The plate 15 and the cathode 5 of the respective amplifiers 3 and 1 are connected to the common terminal 51.

It may be desired, furthermore, to combine in a single transformer the functions of the choke coil 79 and the matching transformer 85, of Fig. 3, as is also effected in the circuit of Fig. 4. The primary winding of the output transformer 85 may be split to provide two choke-coil windings 79 and 89. The coil 79 is connected to the B+ plate-supply voltage terminal and, by way of the conductor 77, to the screen electrode 65 of the amplifier 1 in a manner similar to that described in connection with Fig. 3. One terminal of the coil 89, shown as the top terminal, is connected by a conductor 87 to the screen electrode 67 of the amplifier 3. The bottom terminal of the coil 89 is connected by a further conductor 191 and a resistor 193 through the choke winding 79 to the B+ supply. The screen electrode 65 is by-passed to the cathode 5 of the upper amplifier 1 by the condenser 81. The condenser 83 is connected from the said top terminal of the coil 89 to the B— terminal of the plate-supply voltage. With this arrangement, the screen currents in the amplifiers 1 and 3 flow through the windings 79 and 89 in opposite or bucking directions, thus to balance out the net steady component of flux in the output transformer 85. The secondary 95 of the output transformer 85 is made to conform with the output impedance requirements of the ultimate load, such as the loudspeaker, not shown.

While this circuit does embody two output-circuit primary transformer windings, 79, 89, as do present-day push-pull amplifiers, the use of the series-connected tubes 1 and 3 obviates all problems of distortion introduced by leakage reactance between the windings 79 and 89. This is because in this particular type of circuit connection, the primaries 79 and 89 are connected directly in parallel through the large screen by-pass condensers 81 and 83 and the storage condenser 25. The necessity of tight coupling between the windings 79 and 89 is thus done away with and good performance may be obtained at high frequencies where similar leakage reactance between similar primary windings in conventional push-pull amplifiers would cause switching transients. In operation, the rendering conductive of the upper amplifier 1 by the driving or input voltages across the plate load 55 of the phase-inverter 37, causes the output signals produced by the amplifier 1 to be fed through the winding 79, the condenser 81, and through the parallel-connected winding 89 and the condenser 83. When the upper amplifier 1 is cut off, and the lower amplifier 3 is effective in response to the driving voltages appearing across the cathode load 57 of the phase-inverter 37, the output voltages of the lower amplifier 3 are also fed across the parallel-connected windings 79 and 89. The secondary winding 95 is therefore energized successively by the amplifiers 1 and 3 without serious distortion effects, and this irrespective of loose coupling and leakage reactance between the windings 79 and 89.

In some applications of the present invention, it may be desirable to obtain very high output driving voltages from the phase-inverter tube. A system for accomplishing this purpose, while still maintaining direct-current coupled connections from the phase inverter to the amplifiers 1 and 3, is illustrated in Fig. 5. The phase-inverter tube 37 is there shown not of the triode type illustrated in Figs. 1, 2, 3 and 4, but of the tetrode variety having a plate 43, a cathode 39, a control electrode 41 and a screen electrode 97. The phase-inverter tube 37 receives its plate voltage through the plate or anode load resistor 55 as described in connection with the system of Fig. 4, but it is also connected to a point of higher direct-current potential than the terminal 51 through the resistor 193 that connects with the screen supply of the amplifier 1. The alternating-current potential appearing across the anode load of the phase-inverter driver tube 37, however, is not substantially altered from the value that would appear there-across in the absence of the connection to the screen supply of the amplifier 1, so that balanced alternating-current anti-phase signals may be maintained across the anode and cathode loads of the phase-inverter tube 37. The screen electrode 97 receives voltage from the B+ terminal through the screen dropping resistor 99, and is by-passed to the B— terminal by a condenser 101. The cathode 39 is directly connected to the control electrode 13 of the lower amplifier stage 3, and the plate 43 is directly connected to the control electrode 7 of the upper amplifier tube 1 in a similar manner to that previously described in connection with the system of Fig. 4. The resistors 55, 57, 193 and 99 may be adjusted to values such as to provide any desired bias voltage for the upper series-connected amplifier tube 1 and any desired total plate current for the driver phase-inverter tube 37.

Since the voltage at the screen 65 of the amplifier 1 is at a much higher potential than the cathode 5, large increases in plate current through the phase-inverter tube 37 can be obtained without appreciable change in the effective plate and cathode load impedance of the phase-inverter tube 37. It is therefore possible to inject into the phase-inverter tube 37 large voltages which, in turn, will produce large driving voltages for operating the series-connected amplifier tubes 1 and 3, thereby to provide high-power output. Further to attain this end, the input signals at the terminals 61 and 63 may be amplified by an amplifier 103 prior to their application between the control electrode 41 and the cathode 39 of the phase-inverter driver stage 37. The amplifier 103 is shown, for illustrative purposes, as of the pentode type having a cathode 105, a control electrode 107, a screen electrode 109, a suppressor electrode 111 and a plate 115. The terminals 61 and 63 are connected between the control electrode 107 and the B— supply-voltage terminal. The cathode 105 is, in turn, connected to the B— terminal through an un-by-passed cathode resistor 113. The plate 115 is connected to the B+ terminal of the plate-supply voltage through a plate load 117, and the screen electrode 109 is similarly supplied with energy from the plate-supply voltage through a screen-dropping resistor 119. The screen electrode 109 is by-passed to the B— terminal by a condenser 121. The suppressor electrode 111 is shown strapped to the cathode 105. The output voltages of the amplifier tube 103 appearing at the plate 115 are coupled by a condenser 123 to the control electrode 41 of the phase-inverter driver tube 37.

The cathode 105 is connected, for reasons that will subsequently be explained, by a conductor 125 through a condenser 127 and a resistor 129, to the junction 51 between the anode 15 and the cathode 5 of the series-connected amplifier tubes 3 and 1, respectively. It is by this expedient that feed-back voltage is obtained from the junction 51 of the series-connected tubes 1 and 3 through the dropping resistor 129 to the un-by-passed cathode 105 of the amplifier stage 103. This simple technique for applying negative feed-back voltage is to be contrasted with the feed-back circuits of conventional push-pull amplifiers in which negative feed-back voltage is usually obtained from that developed across the output winding of the output transformer. It is usually necessary to employ this type of more complicated feed-back circuit in conventional push-pull amplifier stages because the amplifier stage to which the feed-back voltage is applied is generally a single-ended stage. There are, thus, serious phase shifts introduced at both low and high frequencies in these customary feed-back circuits including the output transformers. Such phase shifts cause instability and other difficulties, particularly when large amounts of feed-back voltages are employed. In accordance with the present invention, on the other hand, the feed-back voltage, when taken from the junction 51 between the series-connected amplifier tubes 1 and 3, provides a single-ended feed-back connection that, in effect, is taken from the primary side of what might correspond to the output transformer in conventional push-pull amplifier stages.

The windings 79 and 89 are shown connected in the same manner discussed in connection with the system of Fig. 4. Instead, however, of providing an output or secondary winding 95 as in the system of Fig. 4, the screen electrode 65 of the upper amplifier tube 1 is shown connected through the condenser 27 and the desired load to the B— terminal of the plate-supply voltage. The choke windings 79 and 89 thus serve only as screen-potential-supply elements that do not absorb appreciable power. When the upper tube 1 is rendered operative by the voltages in the plate circuit of the phase-inverter driver tube 37, it feeds the load and charges the condenser 27 in the circuit traceable from the B+ terminal of the plate supply through the tube 1 to its cathode 5, through the condenser 81 and the conductor 133 to the condenser 27 and the load; and thence, through the load, to the B— terminal of the supply voltage. When the tube 3 is rendered conductive in response to the voltages in the cathode circuit of the phase-inverter driver tube 37, the load is also fed through the condenser 81, the conductor 133 and the condenser 27. C— bias voltage is applied to the cathode resistor 57 of the phase-inverter tube 37 through a dropping resistor 135, and also to the control electrode 41 through the resistor 137.

If desired, the feed-back circuit feature of Fig. 5 may, of course, be incorporated in the other embodiments of the invention. In the preferred embodiment of Fig. 10, as an example, the circuit of Fig. 4 is shown provided with the above-described feed-back circuit of the type disclosed in Fig. 5. The system of Fig. 10, however, instead of utilizing tetrodes 1 and 3, employs pentodes 1 and 3 having respective suppressor electrodes 65′ and 67′ strapped to their respective cathodes 5 and 11. Instead of utilizing a tetrode phase-inverter 37 and a pentode amplifier 103 as in Fig. 5, moreover, the circuit of Fig. 10 employs a triode phase-inverter 37 and a triode amplifier 103 for driving the phase inverter. A capacitance-resistance input circuit 145—147 is shown connected between the control electrode 107 and the cathode 105 of the amplifier 103. The operation of the circuit is the same as previously described in connection with the system of Fig. 4, and the feedback by way of the condenser 127 and the resistor 129 from the terminal 51 to the cathode 105 of the amplifier 103 is of the same nature discussed in connection with the circuit of Fig. 5.

While the circuit arrangements of Figs. 4, 5 and 10 embodying tetrode or pentode series-connected amplifiers 1 and 3 have been described as energized by phase-inverter driving tubes, it is to be understood that other equivalent sources of anti-phase voltages may also be utilized, though, as before discussed, the use of phase-inverter driver stages has decided practical advantages. A further advantage of the phase-inverter driver stage, not before mentioned, resides in the many different types of connections to the amplifiers 1 and 3 that may be employed, as will now be explained. It has heretofore been stated that the driving voltages for the amplifiers 1 and 3 should be developed, not with respect to ground, but, rather, across the respective cathodes and control electrodes of the upper and lower amplifiers 1 and 3. It is possible, however, instead of applying the anti-phase driving voltages from the phase-inverter tube 37 between the respective cathodes and control electrodes of the upper and lower series-connected amplifiers 1 and 3, to apply these voltages between other pairs of electrodes of the respective series-connected tubes 1 and 3. It is not essential, furthermore, that the cathode of the phase-inverter tube 37 be connected to the lower series-connected amplifier 3, and that the anode of the driver stage 37 be connected to the upper amplifier tube 1. Reverse connections may, if desired, also be utilized. In the system of Fig. 6, as an illustration, the cathode 39 of the phase-inverter tube 37 is shown connected through a coupling condenser 91 to the control electrode 7 of the upper amplifier tube 1. The plate 43 is shown connected through a coupling condenser 75 to the control electrode 13 of the lower amplifier tube 3. The plate 43 is connected through the plate load resistor 55 to the junction 51 between the cathode 5 and the anode 15 of the series-connected amplifiers 1 and 3. The cathode 5 of the upper amplifier tube 1 is provided with the cathode resistor 17 and by-pass condenser 19, and the cathode 11 of the lower amplifier tube 3 is similarly provided with the cathode resistor 21 and its by-pass condenser 23. A grid-leak resistor 93 is connected from the control electrode 13 of the tube 3 to the B— terminal. In this manner, the voltage appearing at the cathode 39 of the phase-inverter tube 37 is applied between the control electrode 7 and the plate 9 of the upper amplifier tube 1. The anti-phase output voltage at the plate 43 of the phase-inverter tube 37 is applied between the control grid 13 and the plate 15 of the lower series-connected tube 3. In this circuit connection, as distinguished from the preceding embodiments of the invention, the anti-phase voltages are developed between the control electrodes and the plates of the respective series-connected amplifier tubes, and the upper tube is fed from the cathode circuit of the phase-inverter driving stage 37, while the lower amplifier 3 is fed from the plate circuit of the phase-inverter driver tube 37.

As still another example, the cathode 39 of the phase-inverter tube 37 of Fig. 7 is shown connected through the coupling condenser 91 to the control electrode 13 of the lower series-connected amplifier 3, and the plate 43 is shown connected through the coupling condenser 75 to the control electrode 7 of the upper amplifier tube 1. The plate 43 of the phase-inverter tube 37 is connected through the plate load 55 directly to the B+ supply terminal, and the cathode 39 is connected through the cathode resistor 57, not to the B— terminal as in the embodiment of Fig. 6, but, rather, to the junction 51 between the cathode 5 and the plate 15 of the series-connected amplifiers 1 and 3. The input terminal 61 is connected through a coupling condenser 141 to the control electrode 41 of the phase-inverter tube 37, and a grid resistor 143 is also provided between the control electrode 41 and an intermediate point of the cathode resistor 57. The input terminal 63 is connected to the B— terminal of the plate-supply voltage as in the embodiment of Fig. 6. In this manner, as in the system of Fig. 6, the amplifier tubes 1 and 3 are alternately energized by voltages developed between their respective control electrodes and plates, but, unlike the system of Fig. 6, the plate 43 of the phase-inverter tube 37 feeds the upper amplifier 1 and the cathode 39 drives the lower amplifier 3.

The systems of Figs. 6 and 7, directed to alternative forms of phase-inverter driving stages may not, for some applications of the invention, be so suitable as the previously discussed embodiments of the invention because larger driving voltages are required. This is because the series-connected amplifier output tubes 1 and 3 are energized, not between their control electrodes and cathodes, as in the other embodiments of the invention, but between their control electrodes and plates. Where large driving voltages are available, however, these circuits of Figs. 6 and 7 may be satisfactorily employed.

In the system of Fig. 7, moreover, it will be observed that the phase-inverter stage is connected between the B+ terminal and the terminal 51 between the cathode 5 and the plate 15 of the series-connected tubes 1 and 3, whereas in the other embodiments of the invention, including Fig. 6, the phase-inverter tube is connected between the said terminal 51 and the B— terminal of the plate-supply voltage. If it is desired to connect the phase-inverter tube in this manner, however, it is to be understood that it is not essential that the plate voltage of the phase-inverter tube be fed to the upper amplifier 1 and the cathode voltage to the lower amplifier 3. The plate voltage of the phase-inverter tube may also be fed to the lower amplifier tube 3, and the cathode voltage, to the upper amplifier 1. Such a connection is shown, for example, in the circuit of Fig. 8.

In the system of Fig. 8, the plate 43 of the phase-inverter stage 37 is connected through the coupling condenser 91 to the control grid 13 of the lower amplifier tube 3. Driving voltages are thus effectively developed between the grid 13 of the lower tube 3 and its cathode 11, which is connected through the cathode resistor 21 to the lower input terminal 63. The cathode 39 of the phase-inverter tube 37, in turn, is connected by the coupling condenser 75 to the control electrode 7 of the upper amplifier tube 1, thereby developing driving signals between the control electrode 7 and the cathode 5 of the amplifier 1. In this fashion, the output stages 1 and 3 are driven between their respective control electrodes and cathodes. Degeneration will be developed, however, in the cathode circuit of the phase-inverter 37 with the connections illustrated in Fig. 8. In order to overcome this difficulty, large driving voltages may be applied to the terminal 61 for energizing the phase-inverter tube 37, thereby to compensate for the cathode degeneration.

Further modifications will occur to those skilled in the art, and all such are considered to fall within the spirit and scope of the present invention as defined in the appended claims.

What is claimed is:

1. An electric system having, in combination, a pair of amplifiers each provided with at least three electrodes comprising an anode, a cathode and a control electrode, means for connecting the cathode of one amplifier to the anode of the other amplifier, means for connecting a source of anode potential between the anode of the said one amplifier and the cathode of the said other amplifier, an electric circuit comprising an electric-energy storing element and a load connected between the anode and the cathode of one of the amplifiers, a phase-inverter driver tube having at least an anode, a cathode and a control electrode, means for applying signals to the phase-inverter driver tube between its control electrode and cathode, substantially equal cathode and anode loads connected, respectively, to the cathode and anode of the phase-inverter driver tube, means for connecting the anode load between the control electrode and the cathode of the said one amplifier, and means for connecting the cathode load between the control electrode and the cathode of the said other amplifier.

2. An electric system having, in combination, a pair of amplifiers each provided with at least four electrodes comprising an anode, a cathode, a control electrode and a screen electrode, means for connecting the cathode of one amplifier to the anode of the other amplifier, means for connecting a source of anode potential between the anode of the said one amplifier and the cathode of the said other amplifier, means comprising a choke coil for supplying screen potential to the screen electrode of the said one amplifier, an electric circuit comprising an electric-energy storing element and a matching transformer connected between the anode and the cathode of one of the amplifiers, and phase-inverter driver tube means for feeding anti-phase signals between the control electrode and the cathode of the respective amplifiers.

3. An electric system having, in combination, a pair of amplifiers each provided with at least three electrodes comprising an anode, a cathode and a control electrode, an input circuit for each amplifier comprising the control electrode and the cathode of the amplifier, an output circuit for each amplifier comprising the anode and the cathode of the amplifier, a terminal, means for connecting the cathode of one amplifier and the anode of the other amplifier to the terminal, means for connecting a direct-current-potential-supplying means in each output circuit, a phase-inverter driver tube having anode and cathode loads, means for feeding alternating-current potential to the phase-inverter driver tube to produce anti-phase alternating-current potentials across the anode and cathode loads, means for connecting the anode load to the input circuit of the said one amplifier and the cathode load to the input circuit of the said other amplifier, means for connecting the anode of the phase-inverter tube to a source of higher direct-current potential than the direct-current potential of the said terminal without substantially altering the alternating-current potential across the anode load of the phase-inverter tube, a load, and means for feeding the load from the output circuit of each amplifier.

4. An electric system having, in combination, a pair of amplifiers each provided with at least four electrodes comprising an anode, a cathode, a control electrode and a screen electrode, an input circuit for each amplifier comprising the control electrode and the cathode of the amplifier, an output circuit for each amplifier comprising the anode and the cathode of the amplifier, a terminal, means for connecting the cathode of one amplifier and the anode of the other amplifier to the terminal, means for connecting a direct-current-potential-supplying means in each output circuit, means comprising choke coils for supplying screen potential to the screen electrodes of the amplifiers, a phase-inverter driver tube having anode and cathode loads, means for feeding alternating-current potential to the phase-inverter driver tube to produce anti-phase alternating-current potentials across the anode and cathode loads, means for connecting the anode load to the input circuit of the said one amplifier and the cathode load to the input circuit of the said other amplifier, means for connecting the anode of the phase-inverter tube to a source of higher direct-current potential than the direct-current potential of the said terminal without substantially altering the alternating-current potential across the anode load of the phase-inverter tube, a load, and means for feeding the load from the output circuit of each amplifier.

5. An electric system having, in combination, a pair of amplifiers each provided with at least four electrodes comprising an anode, a cathode, a control electrode and a screen electrode, an input circuit for each amplifier comprising the control electrode and the cathode of the amplifier, an output circuit for each amplifier comprising the anode and the cathode of the amplifier, a terminal, means for connecting the cathode of one amplifier and the anode of the other amplifier to the terminal, means for connecting a direct-current-potential-supplying means in each output circuit, means for supplying screen potential to the screen electrodes of the amplifiers, a phase-inverter driver tube having anode and cathode loads, means for feeding alternating-current potential to the phase-inverter driver tube to produce anti-phase alternating-current potentials across the anode and cathode loads, means for connecting the anode load to the input circuit of the said one amplifier and the cathode load to the input circuit of the said other amplifier, means for connecting the anode of the phase-inverter tube to a source of higher direct-current potential than the direct-current potential of the said terminal without substantially altering the alternating-current potential across the anode load of the phase-inverter tube, a load, means for feeding the load from the output circuit of each amplifier, means comprising a further amplifier for energizing the phase-inverter driver tube, and means for feeding energy back from the said terminal to the further amplifier.

6. An electric system having, in combination, a pair of amplifiers each provided with at least four electrodes comprising an anode, a cathode, a control electrode and a screen electrode, a terminal, means for connecting the cathode of one amplifier and the anode of the other amplifier to the terminal, means for connecting a source of anode potential between the anode of the said one amplifier and the cathode of the said other amplifier, means comprising choke coils for suppling screen potential to the screen electrodes of the amplifiers, a phase-inverter driver tube having at least an anode, a cathode and a control electrode, cathode and anode loads connected respectively to the cathode and anode of the phase-inverter driver tube, means for feeding alternating-current potential to the control electrodes of the phase-inverter driver tube to produce anti-phase alternating-current potentials across the anode and cathode loads, means for connecting the anode load between the said terminal and the control electrode of the said one amplifier, means for connecting the cathode load between the control electrode and the cathode of the said other amplifier, means for connecting the anode of the phase-inverter driver tube to a source of higher direct-current potential than the direct-current potential of the said terminal without substantially altering the alternating-current potential across the anode load of the phase-inverter tube, a load, and means for connecting each amplifier so that it may alternately energize the load.

7. An electric system having, in combination, a pair of amplifiers each provided with at least four electrodes comprising an anode, a cathode, a control electrode and a screen electrode, a terminal, means for connecting the cathode of one amplifier and the anode of the other amplifier to the terminal, means for connecting a source of anode potential between the anode of the said one amplifier and the cathode of the said other amplifier, means comprising choke coils for supplying screen potential to the screen electrodes of the amplifiers, a phase-inverter driver tube having at least an anode, a cathode and a control electrode, cathode and anode loads connected respectively to the cathode and anode of the phase-inverter driver tube, means comprising a further amplifier for feeding alternating-current potential to the control electrode of the phase-inverter driver tube to produce anti-phase alternating-current potentials across the anode and cathode loads, means for connecting the anode load between the said terminal and the control electrode of the said one amplifier, means for connecting the cathode load between the control electrode and the cathode of the said other amplifier, means for connecting the anode of the phase-inverter driver tube to a source of higher direct-current potential than the direct-current potential of the said terminal without substantially altering the alternating-current potential across the anode load of the phase-inverter tube, a load, means for connecting each amplifier so that it may alternately energize the load, and means for feeding energy back from the said terminal to the further amplifier.

8. An electric system having, in combination, a pair of amplifiers each provided with at least four electrodes comprising an anode, a cathode, a control electrode and a screen electrode, an input circuit for each amplifier comprising the control electrode and the cathode of the amplifier, an output circuit for each amplifier comprising the anode and the cathode of the amplifier, a terminal, means for connecting the cathode of one amplifier and the anode of the other amplifier to the terminal, means for connecting a direct-current-potential-supplying means in each output circuit, means for supplying screen potential to the screen electrodes of the amplifiers, a phase-inverter driver tube having anode and cathode loads, means for feeding alternating-current potential to the phase-inverter tube to produce anti-phase alternating-current potentials across the anode and cathode loads, means for connecting the anode load to the input circuit of the said one amplifier and the cathode load to the input circuit of the said other amplifier, means comprising an electrical connection to the screen potential supply for connecting the anode of the phase-inverter tube to a source of higher direct-current potential than the direct-current potential of the said terminal without substantially altering the alternating-current potential across the anode load of the phase-inverter tube, a load, and means for feeding the load from the output circuit of each amplifier.

9. An electric system having, in combination, a pair of amplifiers each provided with at least four electrodes comprising an anode, a cathode, a control electrode and a screen electrode, an input circuit for each amplifier comprising the control electrode and the cathode of the amplifier, an output circuit for each amplifier comprising the anode and the cathode of the amplifier, a terminal, means for connecting the cathode of one amplifier and the anode of the other amplifier to the terminal, means for connecting a direct-current-potential-supplying means in each output circuit, means comprising choke coils for supplying screen potential to the screen electrodes of the amplifiers, a phase-inverter driver tube having anode and cathode loads, means for feeding alternating-current potential to the phase-inverter tube to produce anti-phase alternating-current potentials across the anode and cathode loads, means for connecting the anode load to the input circuit of the said one amplifier and the cathode load to the input circuit of the said other amplifier, means for connecting the anode of the phase-inverter tube to a source of higher direct-current potential than the direct-current potential of the said terminal without substantially altering the alternating-current potential across the anode load of the phase-inverter tube, a load, and means comprising a winding cooperative with the choke coils for feeding the load from the output circuit of each amplifier.

10. An electric system having, in combination, a pair of amplifiers each provided with at least three electrodes comprising an anode, a cathode and a control electrode, means for connecting the cathode of one amplifier to the anode of the other amplifier, means for connecting a source of anode potential between the anode of the said one amplifier and the cathode of the said other amplifier, an electric circuit comprising an electric-energy storing element and a load connected between the anode and the cathode of one of the amplifiers, a phase-inverter driver tube having at least an anode, a cathode and a control electrode, means for applying signals to the phase-inverter driver tube between its control electrode and cathode, cathode and anode loads connected, respectively, to the cathode and anode of the phase-inverter driver tube, and means for connecting the cathode load between the control electrode and anode of the said one amplifier and the anode load between the control electrode and anode of the said other amplifier.

11. An electric system having, in combination, a pair of amplifiers each provided with at least three electrodes comprising an anode, a cathode and a control electrode, means for connecting the cathode of one amplifier to the anode of the other amplifier, means for connecting a source of anode potential between the anode of the said one amplifier and the cathode of the said other amplifier, an electric circuit comprising an electric-energy storing element and a load connected between the anode and the cathode of one of the amplifiers, a phase-inverter driver tube having at least an anode, a cathode and a control electrode, means for applying signals to the phase-inverter driver tube between its control electrode and cathode, cathode and anode loads connected, respectively, to the cathode and anode of the phase-inverter driver tube, and means for connecting the anode load between the control electrode and anode of the said one amplifier and the cathode load between the control electrode and anode of the said other amplifier.

12. An electric system having, in combination, a pair of amplifiers each provided with at least three electrodes comprising an anode, a cathode and a control electrode, means for connecting the cathode of one amplifier to the anode of the other amplifier, means for connecting a source of anode potential between the anode of the said one amplifier and the cathode of the said other amplifier, an electric circuit comprising an electric-energy storing element and a load connected between the anode and the cathode of one of the amplifiers, a phase-inverter driver tube having at least an anode, a cathode and a control electrode, means for applying signals to the phase-inverter driver tube between its control electrode and cathode, cathode and anode loads connected, respectively, to the cathode and anode of the phase-inverter driver tube, and means for connecting the cathode load between the control electrode and the cathode of the said one amplifier and the anode load between the control electrode and the cathode of the said other amplifier.

13. An electric system having, in combination, a pair of amplifiers each provided with at least three electrodes comprising an anode, a cathode and a control electrode, means for connecting the cathode of one amplifier to the anode of the other amplifier, means for connecting a source of anode potential between the anode of the said one amplifier and the cathode of the said other amplifier, an electric circuit comprising a load connected between the anode and the cathode of the said other of the amplifiers, a phase-inverter driver tube having at least an anode, a cathode and a control electrode, substantially equal anode and cathode load resistors connected to the anode and cathode, respectively, of the phase-inverter driver tube, electrical connections from the terminals of the anode load resistor to the control electrode and another electrode of one of the amplifiers, and electrical connections from the terminals of the cathode load resistor to the control electrode and another electrode of the other of the amplifiers corresponding to the first-named other electrode.

14. An amplifier circuit for driving a load, said circuit including a pair of series-connected tubes for providing substantially balanced output for said load, the tubes each having at least a cathode, grid and plate, the cathode of the first tube and plate of the second tube being joined at least signal-wise and forming thereby a load-connecting juncture, the load adapted to be connected between said juncture and ground, there being a potential source connected between the plate of the said first tube and the cathode of the second tube, an input stage for receiving an incoming signal and applying a component of same to the grid of the said first tube and including a third tube having cathode, grid, and plate, with the plate being connected to the grid of the said first tube, means for applying a second component of the incoming signal to the grid of said second tube, and means for applying a load sensing voltage to the grid of said first tube for lifting the input signal thereof above the load signal, which comprises a connection between the juncture and the plate of the said third tube and having at least a series-connected impedance therein serving as the plate load of the said third tube, the signal components applied to the said first and second tubes being substantially of equal amplitude and opposed phase.

15. An amplifier circuit for driving a load, said circuit including a pair of series-connected tubes for providing substantially balanced output for said load, the tubes each having at least a cathode, grid and plate, the cathode of the first tube and plate of the second tube being joined at least signal-wise and forming thereby a load-connecting juncture, the load adapted to be connected between said juncture and a reference potential, there being a potential source connected between the plate of the said first tube and the cathode of the second tube, an input stage for receiving an incoming signal and applying a component of same to the grid of the said second tube and including a third tube having a cathode, grid and plate, with the plate of the third tube being connected to the grid of the said second tube, means for applying a second component of the incoming signal to the grid of the said first tube, means for applying a load-sensing voltage to the grid of said second tube for decreasing the input signal thereof below the value it would assume in the absence of the load signal in order to maintain balanced operation of the first and second tubes, which comprises a connection between the said juncture and the plate of the said third tube and having at least a series-connected impedance therein serving as the plate load of the said third tube, the signal components applied to the said first and second tubes being substantially of equal amplitude and opposed phase.

16. An amplifier circuit for driving a load, said circuit including a pair of series-connected tubes for providing substantially balanced output for said load, the tubes each having at least a cathode, grid and plate, the cathode of the first tube and plate of the second tube being joined at least signal-wise and forming thereby a load-connecting juncture, the load adapted to be connected between said juncture and a reference potential, there being a potential source connected between the plate of the said first tube and the cathode of the second tube, an input stage for receiving an incoming signal and applying a component of same to the grid of one of the said tubes and including a third tube having a cathode, grid and plate, with the plate of one of the said tubes, means for applying a second component of the incoming signal to the grid of the other of the said tubes, and means for applying a load-sensing voltage to the grid of one of the said tubes for modifying the input signal thereof from the value it would assume in the absence of the load signal in order to maintain balanced operation of the first and second tubes, which comprises a connection between the said juncture and the plate of the said third tube and having at least a series-connected impedance therein serving as the plate load of the said third tube, the signal components applied to the said first and second tubes being substantially of equal amplitude and opposed phase.

17. In an amplifier of the character described, in which there is a push-pull single-ended output including at least two tubes each having at least a plate, a grid, and a cathode, and in which the cathode of one tube is electrically connected at least signal-wise to the plate of the second tube forming a juncture therewith and in which the load is in the cathode circuit of said one tube so that the output of said one tube when driven from ground is normally dependent upon the load voltage, there being a B supply across the tubes together, said amplifier having means for rendering the input to the said first tube independent of the load voltage, and said two tubes each having a screen grid; means for supplying the screen grids comprising, the screen grid of said one tube being connected to positive B through a dropping impedance and being bypassed to its cathode, and the screen grid of the second tube being connected to the said juncture through a dropping impedance and being by-passed to ground, the said impedances being chokes arranged on a common core with their windings in D. C. bucking relationship.

18. In an amplifier of the character described, in which there is a push-pull output including at least two screen grid tubes connected in series, with the cathode of one tube connected to the plate of the other and forming thereby a juncture, there being a B supply connected from the plate of the said one tube to the cathode of the said second tube, means for supplying the screen grids and the load which comprises a three winding transformer, one winding being connected from B plus to the screen grid of the said one tube, a second winding in D. C. bucking relationship being connected between the said juncture and the screen grid of the said second tube, and the third winding being connected across the load.

19. An amplifier circuit having, in combination, a pair of amplifiers each having at least anode, cathode and grid electrodes, means for connecting the cathode of one amplifier to the anode of the other amplifier, means for connecting a source of anode potential between the anode of the said one amplifier and the cathode of the said other amplifier, a load connected between the anode and the cathode of one of the amplifiers, signal-voltage input terminals, means for applying between the grid and cathode of the said one amplifier a first voltage which is a function of both the voltage at the input terminals and the voltage developed across the load, and means for applying between the grid and cathode of the said other amplifier a second voltage of substantially the same amplitude as but of opposite phase to the first voltage and which is substantially the same said function of both the voltage at the input terminals and the voltage developed across the load.

20. An amplifier circuit having, in combination, a pair of amplifiers each having at least anode, cathode and grid electrodes, means for connecting the cathode of one amplifier to the anode of the other amplifier, means for connecting a source of anode potential between the anode of the said one amplifier and the cathode of the said other amplifier, a load connected between the anode and the cathode of one of the amplifiers, signal-voltage input terminals, means for applying between the grid and another of the electrodes of the said one amplifier a first voltage which is a function of both the voltage at the input terminals and the voltage developed across the load, and means for applying between the grid and another of the electrodes of the said other amplifier corresponding to the said another electrode of the said one amplifier a second voltage of substantially the same amplitude as but of opposite phase to the first voltage and which is substantially the same said function of both the voltage at the input terminals and the voltage developed across the load.

References Cited in the file of this patent

UNITED STATES PATENTS

| | | |
|---|---|---|
| 1,999,327 | Holden | Apr. 30, 1935 |
| 2,310,342 | Artzt | Feb. 9, 1943 |
| 2,423,931 | Etter | July 15, 1947 |
| 2,428,295 | Scantlebury | Sept. 30, 1947 |
| 2,446,025 | Rockwell | July 27, 1948 |
| 2,477,074 | McIntosh | July 26, 1949 |
| 2,488,567 | Stodola | Nov. 22, 1949 |
| 2,561,425 | Stachura | July 24, 1951 |
| 2,646,467 | McIntosh | July 21, 1953 |
| 2,659,775 | Coulter | Nov. 17, 1953 |

OTHER REFERENCES

Terman text, "Radio Engineering," 3d ed., pages 301–303, published 1947, by McGraw-Hill Book Co., New York City.